US012652048B2

(12) United States Patent
Chinthu et al.

(10) Patent No.: US 12,652,048 B2
(45) Date of Patent: Jun. 9, 2026

(54) NEGATIVE VOLTAGE LEVEL SHIFTER

(71) Applicant: GlobalFoundries U.S. Inc., Malta, NY (US)

(72) Inventors: Siva Kumar Chinthu, Bangalore (IN); Suresh Pasupula, Bangalore (IN); Devesh Dwivedi, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 47 days.

(21) Appl. No.: 18/777,717

(22) Filed: Jul. 19, 2024

(65) Prior Publication Data

US 2026/0025141 A1 Jan. 22, 2026

(51) Int. Cl.
*H03K 19/0185* (2006.01)

(52) U.S. Cl.
CPC ............................ *H03K 19/018521* (2013.01)

(58) Field of Classification Search
CPC ............... H03K 19/018521; H03K 19/018514
See application file for complete search history.

(56) References Cited

U.S. PATENT DOCUMENTS 5,204,557 A * 4/1993 Nguyen ........... H03K 3/356017
326/70
5,406,142 A * 4/1995 Nakama ........... H03K 3/356017
326/121

| | | | |
|---|---|---|---|
| 7,061,298 B2 | 6/2006 | Mentze et al. | |
| 7,705,630 B1 | 4/2010 | Huang et al. | |
| 10,050,524 B1 * | 8/2018 | Rana ...................... | G06F 1/324 |
| 2024/0030917 A1 * | 1/2024 | Turner .......... | H03K 19/018521 |

OTHER PUBLICATIONS

Tsiatouhas, Yiorgos; "A Stress-Relaxed Negative Voltage-Level Converter"; IEEE Transactions on Circuits and Systems-II: Express Briefs; vol. 54; No. 3; Mar. 2007; pp. 282-286.
Liu, Peijun et al.; "A Novel High-Speed and Low-Power Negative Voltage Level Shifter for Low Voltage Applications"; IEEE; pp. 601-604; Copyright 2010 IEEE.

* cited by examiner

*Primary Examiner* — Daniel D Chang
(74) *Attorney, Agent, or Firm* — David Cain; Hoffman Warnick LLC

(57) ABSTRACT

A negative voltage level shifter. A circuit is provided that includes a first input path that couples an input node to a gate of a first n-type metal-oxide semiconductor (NMOS) transistor, wherein the first NMOS transistor has a drain coupled to a zero volt supply and a source coupled to a gate of a second NMOS transistor, wherein the second NMOS transistor incudes a source coupled to a negative power supply of −V volts and a drain coupled to an output node; and a second input path that couples the input node to a gate of a third NMOS transistor via an inverter, wherein the third NMOS transistor has a drain coupled to the zero volt supply and a source coupled to the output node.

19 Claims, 4 Drawing Sheets

NEGATIVE VOLTAGE LEVEL SHIFTER

BACKGROUND

The present disclosure relates generally to level shifters, and, more particularly, to a negative voltage level shifter implemented with low voltage metal-oxide-semiconductor field-effect transistors (MOSFETS).

Low power supply voltages (e.g., 1.8 volts or lower) are becoming more common in electronic circuits, which for example allow for low energy consumption in battery powered devices. In certain low voltage implementations, negative voltages are utilized, which require a negative voltage level shifter to, e.g., couple the output signal of a first integrated circuit having positive operating voltage swing with the input of a second integrated circuit having negative operating voltage swing.

Designs for such negative voltage level shifters have been developed that include low voltage transistors for reduced power consumption. However, at least some of the low voltage transistors in these voltage level shifters may operate outside their safe operating areas (SOAs). Design modifications intended to avoid SOA violations have included, for example, the use of asymmetric high voltage transistors (e.g., laterally diffused metal oxide semiconductor field effect transistors (LDMOSFETs)) in place of at-risk low voltage transistors and/or the use of static bias circuits. However, these design modifications typically add to circuit complexity, power consumption, and area.

SUMMARY

All aspects, examples and features mentioned below can be combined in any technically possible way.

An aspect of the disclosure provides a level shifter circuit, including: a first input path that couples an input node to a gate of a first n-type metal-oxide semiconductor (NMOS) transistor, wherein the first NMOS transistor has a drain coupled to a zero volt supply and a source coupled to a gate of a second NMOS transistor, wherein the second NMOS transistor incudes a source coupled to a negative power supply of −V volts and a drain coupled to an output node; and a second input path that couples the input node to a gate of a third NMOS transistor via an inverter, wherein the third NMOS transistor has a drain coupled to the zero volt supply and a source coupled to the output node.

Another aspect of the disclosure provides an integrated circuit, having a level shifter circuit that includes: a first input path that couples an input node to a gate of a first n-type metal-oxide semiconductor (NMOS) transistor, wherein the first NMOS transistor has a drain coupled to a zero volt supply and a source coupled to a gate of a second NMOS transistor, wherein the second NMOS transistor incudes a source coupled to a negative power supply of −V volts and a drain coupled to an output node; and a second input path that couples the input node to a gate of a third NMOS transistor via an inverter, wherein the third NMOS transistor has a drain coupled to the zero volt supply and a source coupled to the output node.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
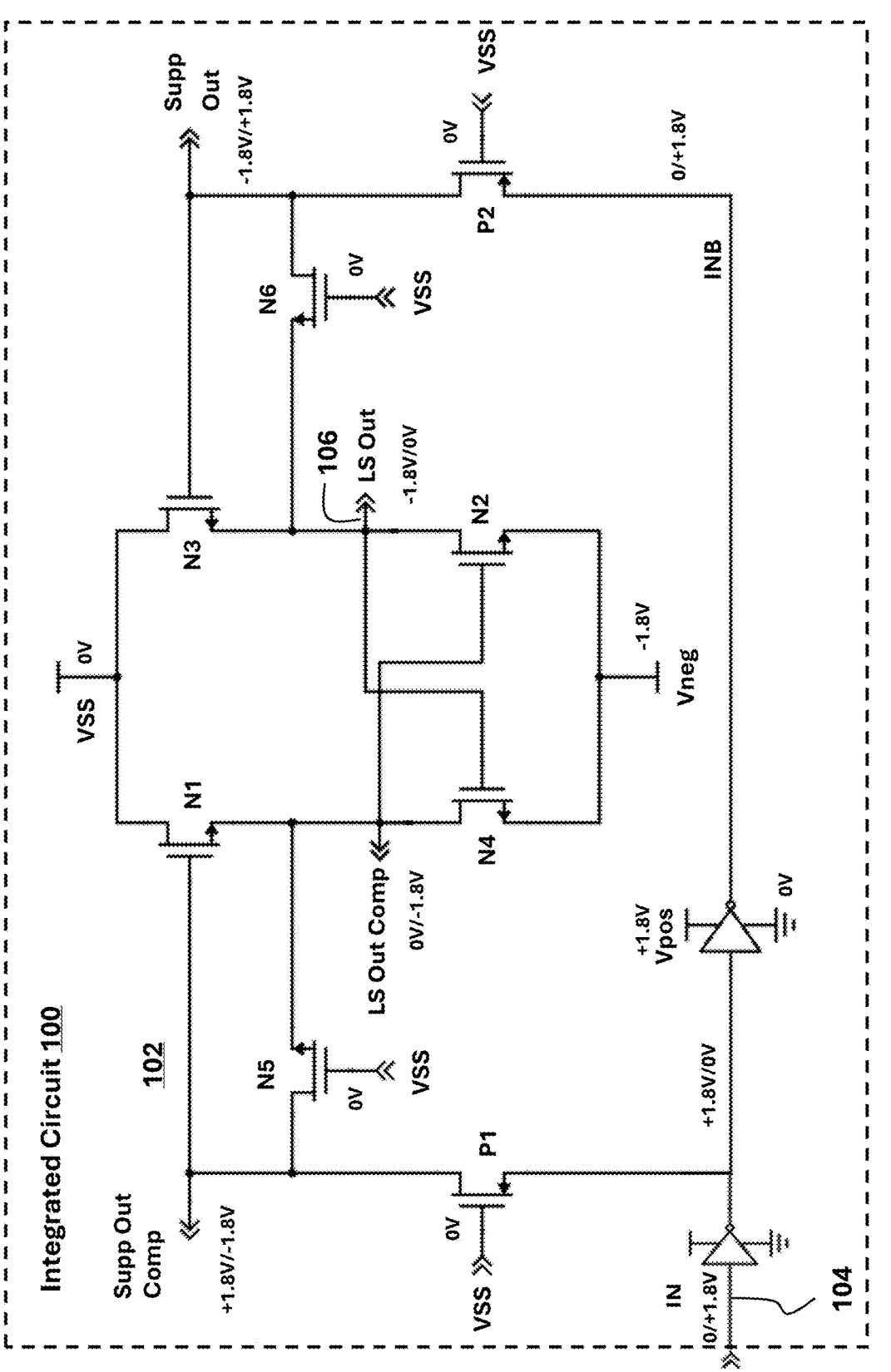
FIG. 1 shows a block diagram of an integrated circuit having a negative voltage level shifter, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of this disclosure provide a negative voltage level shifter suitable for use in various low voltage applications including, e.g., input/output (IO) applications, analog applications, embedded non-volatile memory (eNVM) technologies, etc. In the illustrative embodiments, a level shifter is implemented with 1.8 voltage devices having supply voltages of +/−1.8 volts, however it is understood that less than 1.8 voltage devices and supplies could be utilized. Those skilled in the art will recognize that FETs typically have a technology-specified safe operating area (SOA). The technology-specified SOA includes several maximum operating voltage conditions including, but not limited to, a maximum gate-source voltage (VGSmax), a maximum drain-gate voltage (VDGmax), and a maximum drain-source voltage (VSDmax). All transistors within the disclosed negative voltage level shifter can be symmetric transistors with the same VGSmax, VDGmax, and VDSmax. For example, if the transistors are 1.8 V-rated transistors, VGSmax, VDGmax, and VDSmax could all be approximately equal to the absolute value of 1.8 V) (e.g., at the absolute value of 1.98 V). The described level shifter can be implemented without causing device stress (i.e., without safe operating area (SOA) violations) and without requiring any specialized high voltage devices (i.e., asymmetric devices, such as laterally diffused metal oxide semiconductor field effect transistors (LDMOSFETs)). Instead, only symmetric low voltage complementary metal-oxide semiconductor (CMOS) devices are required.

FIG. 1 depicts an integrated circuit 100 having a negative voltage level shifter circuit ("level shifter") 102 that includes an input node 104 (IN) and a negative level shifted output node 106 (LS Out). The level shifter 102 converts a positive input signal at the input node 104, which swings from ground (i.e., 0 volts) to a positive voltage V (i.e., +1.8 volts), into a negative output signal at the output node 106, which swings from a negative voltage –V (i.e., –1.8 volts) to ground (i.e., 0 volts). The level shifter also outputs a complementary output signal LS Out Comp, which outputs 0 volts when output node 106 is –1.8 volts and outputs –1.8 volts when output node 106 is 0 volts. An additional supplemental output node (Supp Out) is also provided that outputs –1.8 volts when the input signal is 0 volts and outputs 1.8 volts when the input signal is 1.8 volts. A complementary supplemental output node (Supp Out Comp) outputs the complement of Supp Out, i.e., it outputs 1.8 volts when Supp Out is –1.8 volts and outputs –1.8 volts when Supp Out is 1.8 volts.

Figure 2:
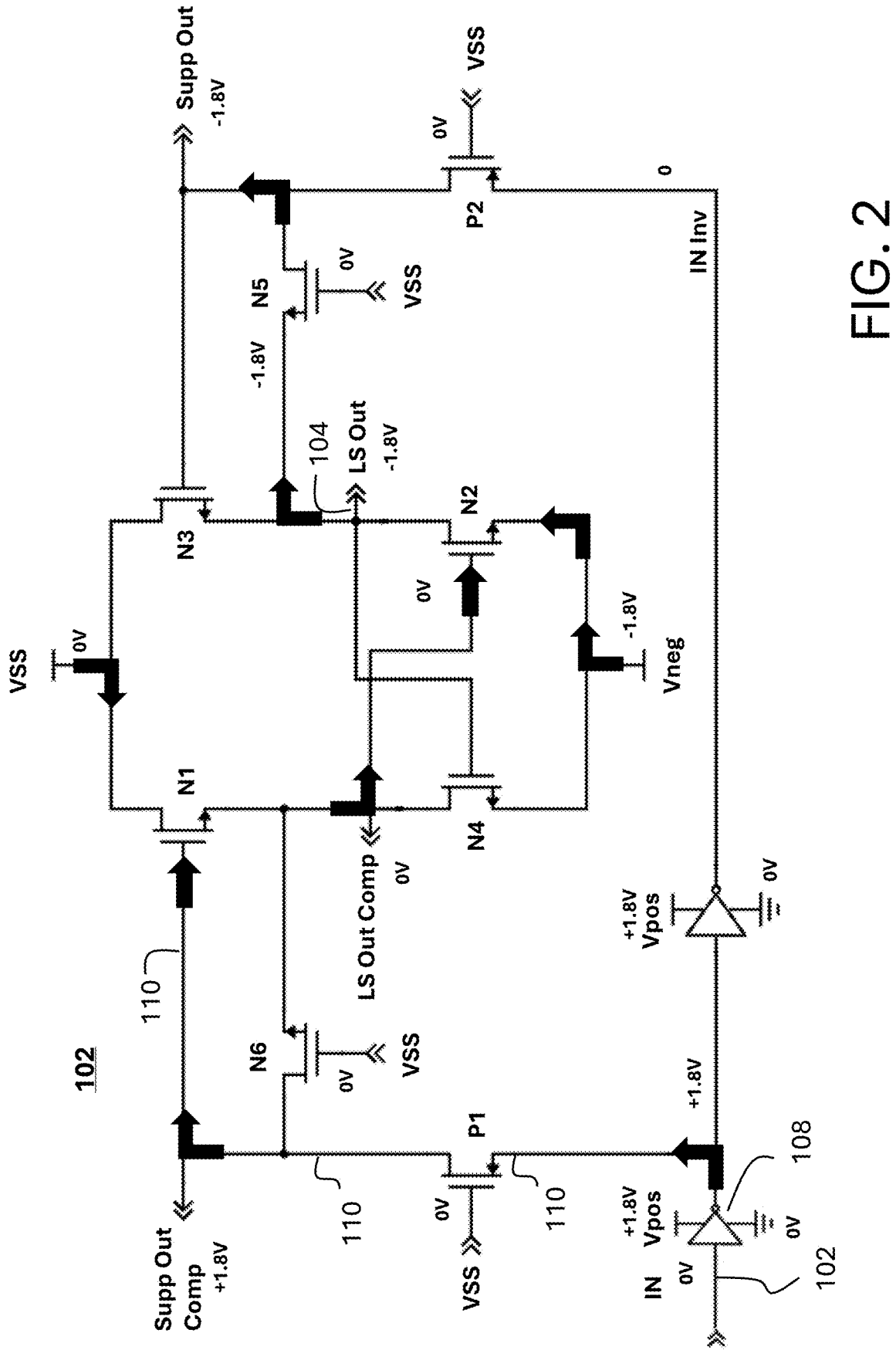
FIG. 2 shows the negative voltage level shifter circuit of FIG. 1 operating at a first input level, according to embodiments of the disclosure.
Figure 3:
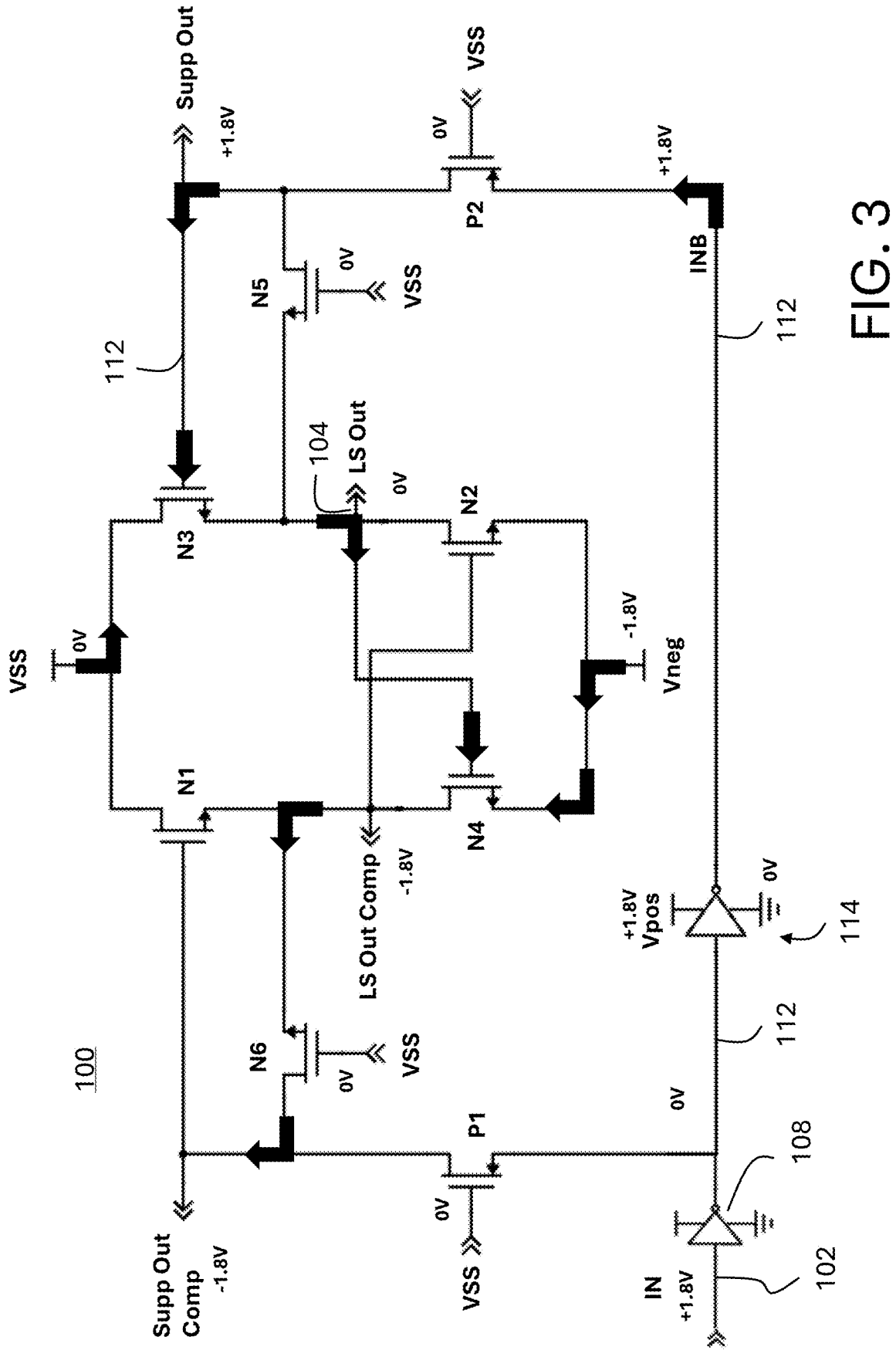
FIG. 3 shows the negative voltage level shifter circuit of FIG. 1 operating at a second input level, according to embodiments of the disclosure.

FIGS. 2 and 3 describe the operation of level shifter 102 with bolded arrows showing relevant signal flows. Referring first to FIG. 2, the operation of level shifter 102 is described when the input signal at input node 102 is 0 volts. Initially the input signal is passed through inverter 108, which converts the signal from 0 to 1.8 volts, which then travels along a first input path 110. Input path 110 includes a p-type metal-oxide semiconductor (PMOS) P1, which has a continuous 0 volt supply voltage VSS at its gate, allowing the 1.8 volt signal to pass through its source and drain to the gate of an n-type metal-oxide semiconductor (NMOS) N1. NMOS N1 is activated by the 1.8 volt signal, which in turn causes VSS (i.e., 0 volts) to pass through the drain and source of NMOS N1 and onto the gate of NMOS N2. At the same time, the 0 volts from VSS is output at LS Out Comp. The 0 volt input at the gate of NMOS N2 allows the –1.8 volt signal from Vneg to pass through the source and drain of NMOS N2 to the negative level shifted output (LS Out) 104. Thus, the 0 volt input signal at input node 102 results in a level shifted output signal of –1.8 volts at output node 104. In addition, the –1.8 volt signal is passed through the source and drain of the NMOS N5, whose gate is at VSS or 0 volts, and onto the supplemental output node Supp Out. Accordingly, when the input signal is zero volts, LS Out is –1.8 volts, LS Out Comp is zero volts, Supp Out is –1.8 volts, and Sup Out Comp is 1.8 volts.

Referring to FIG. 3, the operation of level shifter 102 is described when the input signal at input node 102 is 1.8 volts. Initially the input signal is passed through inverter 108, which converts the signal from 1.8 volts to 0 volts, which then travels along a second input path 112. Input path 112 includes a second inverter 114 which converts the 0 volts back to 1.8 volts and a second PMOS P2, which has a continuous 0 volt supply voltage VSS at its gate, allowing the 1.8 volt signal to be passed through its source and drain and outputted at the supplemental output node (Supp Out). At the same time, the 1.8 volt signal along input path 112 travels through to the gate of NMOS N3, which in turn causes VSS (0 volts) to pass through the drain and source of NMOS N3, which is outputted at the level shifted output node 104. Thus, the input signal of 1.8 volts at input node 102 results in a level shifted output signal of 0 volts at output node 104. At the same time, the 0 volts travels onto the gate of NMOS N4, which allows the –1.8 volt signal from Vneg to pass through the source and drain of NMOS N4 to the complementary level shifted output node (LS Out Comp). In addition, the –1.8 volt signal is passed through the source and drain of the NMOS N6, whose gate is at VSS or 0 volts, and onto the complementary supplemental output node (Supp Out Comp). Accordingly, when the input signal 102 is 1.8 volts, LS Out is zero volts, LS Out Comp is –1.8 volts, Supp Out is 1.8 volts, and Sup Out Comp is –1.8 volts. With a negative voltage level shifter configured and operating as described above and illustrated in FIGS. 1-3, the operating VGS, VDG and VDS of each transistor is generally no greater than the absolute value of 1.8 V. Therefore, none of the transistors within the negative voltage level shifter exhibits a violation of VGSmax, VDGmax and VDSmax. That is, all of the symmetric low voltage transistors operate within their respective SOAs.

It is noted that in the above embodiments, all of the NMOS and PMOS devices are 1.8 voltage devices, which allows for a low-cost implementation. (As noted, although described using 1.8 volt devices, it is understood that level shifter 102 could be implemented with any low voltage devices, i.e., less than 1.8 volts.) In addition, level shifter 102 provides two pairs of output voltages (LS Out/LS Out Comp and Supp Out/Supp Out Comp), which allows the circuit to achieve high speed with little or no device stress. Furthermore, level shifter 102 can be implemented with minimal area (e.g., 6.32 microns×6.6 microns=42.25 microns$^2$), with very little delay (e.g., about 1 nano second), and with low static current (e.g., about 1.5 nanoamperes). The level shifter 102 can be implemented in any technology, including 22 nanometer fully depleted silicon-on-insulator (FDSOI) technology. Such implementations, e.g., allow for a resistive random-access memory (RRAM) design with negative voltage erase operations to meet power, performance and area (PPA) requirements. Furthermore, the level shifter does not require any biasing apart from the power supply.

Figure 4:
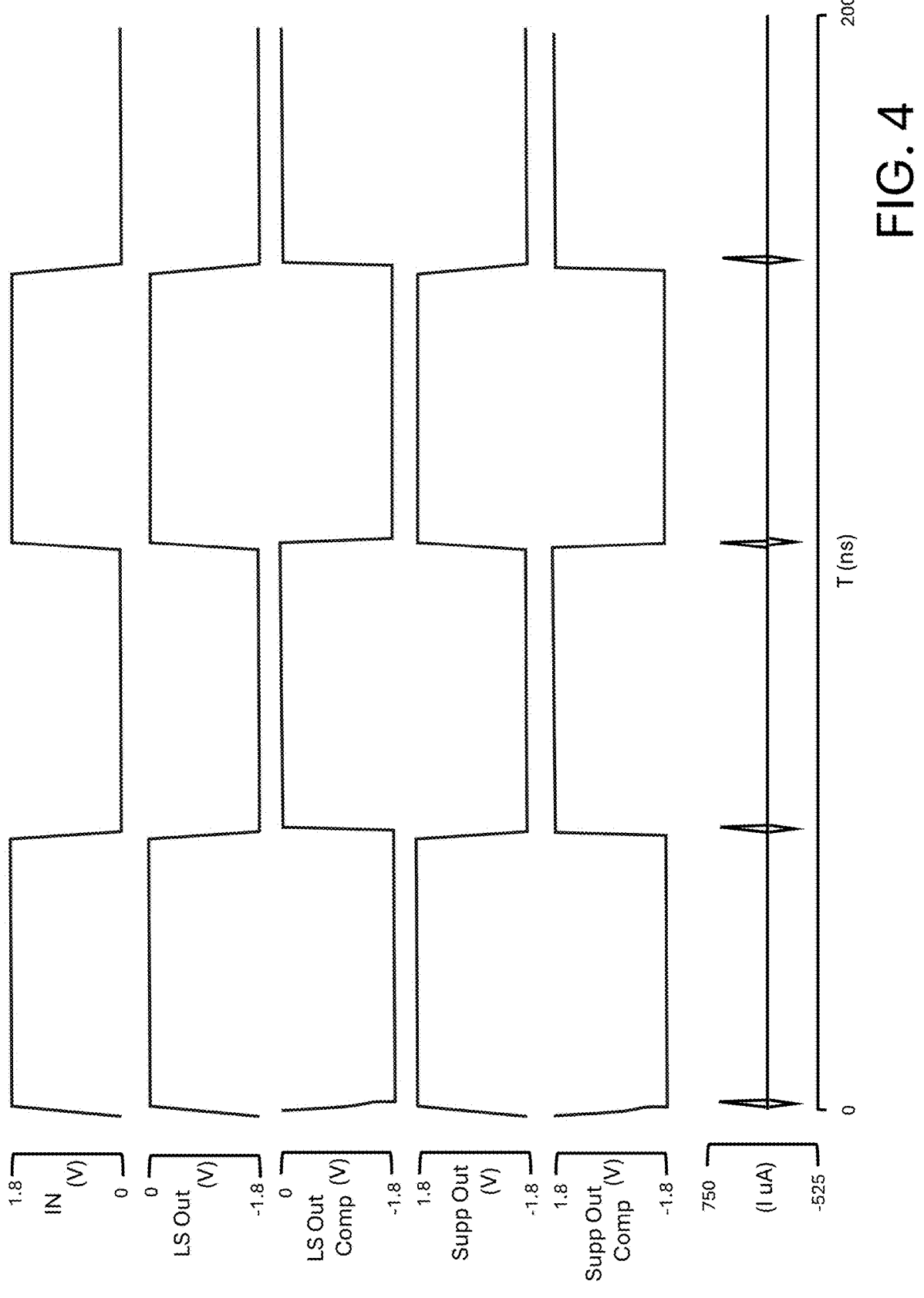
FIG. 4 shows the waveforms of the input and outputs of the voltage level shifter of FIG. 1, according to embodiments of the disclosure.

FIG. 4 shows the voltage level waveforms of the input (IN) and associated outputs, LS Out, LS Out Comp, Supp Out, and Supp Out Comp. When the input (IN) toggles from 0 to 1.8, LS Out toggles from –1.8 to 0, LS Out Comp toggles from 0 to –1.8, Supp Out toggles from –1.8 to 1.8, and Supp Out Comp toggles from 1.8 to –1.8. When the input (IN) toggles from 1.8 to 0, LS Out toggles from 0 to –1.8, LS Out Comp toggles from –1.8 to 0, Supp Out toggles from 1.8 to –1.8, and Supp Out Comp toggles from –1.8 to 1.8. Additionally, as shown in the bottom waveform, the static current ranges from about –525 uA to 750 uA, less than 1500 uA.

The terminology used herein is for the purpose of describing particular embodiments only and is not intended to be limiting of the disclosure. As used herein, reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed. It will be further understood that the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not. It will be further understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A level shifter circuit, comprising:
a first input path that couples an input node to a gate of a first n-type metal-oxide semiconductor (NMOS) transistor, wherein the first NMOS transistor has a drain coupled to a zero volt supply and a source coupled to a gate of a second NMOS transistor, wherein the second NMOS transistor incudes a source coupled to a negative power supply of −V volts and a drain coupled to an output node; and
a second input path that couples the input node to a gate of a third NMOS transistor via an inverter, wherein the third NMOS transistor has a drain coupled to the zero volt supply and a source coupled to the output node;
wherein the input node receives an input signal that transitions between zero volts and V volts, and wherein the first input path includes a first p-type metal-oxide semiconductor (PMOS) transistor having a gate coupled to the zero volt supply and wherein the second input path includes a second PMOS transistor having a gate coupled to the zero volt supply.

2. The level shifter circuit of claim 1, wherein the output node outputs zero volts from the zero volt supply in response to an input signal of V volts.

3. The level shifter circuit of claim 1, wherein the output node outputs −V volts from the negative power supply in response to an input signal of zero volts.

4. The level shifter circuit of claim 1, further comprising a fourth NMOS transistor having a gate coupled to the output node, a source coupled to the negative power supply, and a drain coupled to a complementary output node, the complementary output node being further coupled to the source of the first NMOS transistor.

5. The level shifter circuit of claim 4, wherein the complementary output node outputs −V volts from the negative power supply in response to an input signal of V volts and outputs zero volts from the negative power supply in response to an input signal of zero volts.

6. The level shifter circuit of claim 1, further comprising a supplemental output node coupled to a drain of the second PMOS transistor and a drain of a fifth NMOS transistor.

7. The level shifter circuit of claim 6, wherein the supplemental output node outputs −V volts from the negative power supply in response to an input signal of 0 volts and outputs V volts in response to an input signal of V volts.

8. The level shifter circuit of claim 1, wherein the level shifter circuit only includes 1.8 volt complementary metal-oxide semiconductor devices.

9. The level shifter circuit of claim 1, wherein V is less than 1.8 volts.

10. The level shifter circuit of claim 1, further comprising a second inverter having an input coupled to the input node and an output coupled to the first input path and second input path.

11. The level shifter circuit of claim 1, wherein V is 1.8 volts.

12. The level shifter circuit of claim 1, further comprising a complementary supplemental output node coupled to a drain of the first PMOS transistor and a drain of a sixth NMOS transistor.

13. The level shifter circuit of claim 12, wherein the complimentary supplemental output node outputs V volts in response to an input signal of V volts and outputs −V volts from the negative power supply in response to an input signal of V volts.

14. An integrated circuit, comprising:

a level shifter circuit, having:

a first input path that couples an input node to a gate of a first n-type metal-oxide semiconductor (NMOS) transistor, wherein the first NMOS transistor has a drain coupled to a zero volt supply and a source coupled to a gate of a second NMOS transistor, wherein the second NMOS transistor incudes a source coupled to a negative power supply of −V volts and a drain coupled to an output node; and a second input path that couples the input node to a gate of a third NMOS transistor via an inverter, wherein the third NMOS transistor has a drain coupled to the zero volt supply and a source coupled to the output node;

wherein the first input path includes a first p-type metal-oxide semiconductor (PMOS) transistor having a gate coupled to the zero volt supply and wherein the second input path includes a second PMOS transistor having a gate coupled to the zero volt supply.

15. The integrated circuit of claim 14, wherein the input node receives an input signal that transitions between zero volts and V volts.

16. The integrated circuit of claim 15, wherein the output node outputs zero volts from the zero volt supply in response to an input signal of V volts.

17. The integrated circuit of claim 15, wherein the output node outputs −V volts from the negative power supply in response to an input signal of zero volts.

18. The integrated circuit of claim 15, further comprising a fourth NMOS transistor having a gate coupled to the output node, a source coupled to the negative power supply, and a drain coupled to a complementary output node, the complementary output node being further coupled to the source of the first NMOS transistor.

19. The integrated circuit of claim 18, wherein the complementary output node outputs −V volts from the negative power supply in response to an input signal of V volts and outputs zero volts from the negative power supply in response to an input signal of zero volts.

* * * * *